United States Patent [19]
Dawson et al.

[11] Patent Number: 6,027,859
[45] Date of Patent: Feb. 22, 2000

[54] SEMICONDUCTOR SUBSTRATE HAVING EXTENDED SCRIBE LINE TEST STRUCTURE AND METHOD OF FABRICATION THEREOF

[75] Inventors: Robert Dawson, Austin; Mark W. Michael, Cedar Pond; Fred Hause, Austin, all of Tex.

[73] Assignee: Advanced Micro Devices, Inc., Sunnyvale, Calif.

[21] Appl. No.: 08/992,234

[22] Filed: Dec. 17, 1997

[51] Int. Cl.⁷ ........................................ G03F 7/20
[52] U.S. Cl. .................... 430/312; 430/311; 430/394; 430/396
[58] Field of Search ................... 430/312, 313, 430/314, 394, 396

[56] References Cited

U.S. PATENT DOCUMENTS

| | | | |
|---|---|---|---|
| 5,206,181 | 4/1993 | Gross | 437/8 |
| 5,386,623 | 2/1995 | Okamoto et al. | 29/832 |
| 5,472,813 | 12/1995 | Nakagawa et al. | 430/5 |
| 5,497,076 | 3/1996 | Kuo et al. | 324/158.1 |
| 5,677,248 | 10/1997 | Sakai et al. | 437/228 |
| 5,723,236 | 3/1998 | Inoue et al. | 430/5 |
| 5,792,591 | 8/1998 | Theiwissen | 430/312 |
| 5,811,222 | 9/1998 | Gardner et al. | 430/312 |
| 5,832,601 | 10/1998 | Eldridge et al. | 29/843 |

*Primary Examiner*—Sharon Gibson
*Assistant Examiner*—Jill N. Holloman

[57] ABSTRACT

The present invention generally provides a semiconductor substrate having an extended test structure and a method of fabricating such a substrate. A method of forming an extended test structure on a semiconductor substrate, consistent with one embodiment of the invention, includes forming a first test structure pattern over a first portion of the substrate and forming a second test structure pattern of the second portion of the substrate which partially overlaps the first portion of the substrate such that the first test structure pattern and the second test structure overlap. The first test structure pattern may be formed using, for example, reticle and a second test structure pattern may be formed using the same reticle. The first and second test structure patterns may, for example, be formed in a scribe line of the substrate.

17 Claims, 4 Drawing Sheets

SEMICONDUCTOR SUBSTRATE HAVING EXTENDED SCRIBE LINE TEST STRUCTURE AND METHOD OF FABRICATION THEREOF

FIELD OF THE INVENTION

The present invention generally relates to semiconductor devices and, more particularly, to a semiconductor substrate having one or more extended scribe line test structures and a process of fabricating such a semiconductor substrate.

BACKGROUND OF THE INVENTION

The fabrication of semiconductor devices typically involves the formation of large numbers of integrated circuits or die on a silicon substrate or wafer. Fabrication of each die typically involves forming multiple layers over the semiconductor substrate and incorporating various impurities into the layers as well as the semiconductor substrate. The patterns used to form these layers and define regions in which impurities are incorporated are typically created using lithographic techniques.

The lithography process typically involves applying a photoresist layer (e.g., $SiO_2$) over the surface of the semiconductor wafer and exposing the photoresist layer to a patterned light source. The light source is typically patterned using an exposure tool, such as a mask or reticle. The exposure tool typically contains clear and opaque features which generally define the pattern to be created in the photoresist layer. The exposed photoresist is then developed and regions of the photoresist are dissolved such that the pattern is transferred to the photoresist layer. The exposed regions of the underlying semiconductor wafer layer are then processed by, for example, etching the exposed wafer layer, depositing a material on the exposed wafer layer, or doping the exposed wafer layer. For a given die, the photolithography process may be used a number of times as layers are formed over layers to form the ultimate semiconductor device structure.

A number of different lithographic techniques may be used to project patterns onto a wafer. One common system for exposing the semiconductor wafer is a step-and-repeat system or stepper system. A stepper system generally includes an optical system having a light source and a reticle and a stepper for stepping or indexing the semiconductor wafer under the optical system. The reticle typically includes a pattern having one or more die patterns each of which are used to form a layer of a different die on the semiconductor wafer. In use, the semiconductor wafer is exposed by the optical system and the pattern on the reticle is transferred to the semiconductor wafer. The wafer is then stepped or indexed by the stepper to an adjacent field of the substrate and the adjacent field is exposed to the reticle pattern. Care is typically taken to prevent reticle flashes from overlapping one another. After the entire wafer is exposed, the photoresist is then developed to remove portions of the photoresist and prepare the wafer for subsequent processing, such as etching deposition or doping. Thereafter, the semiconductor may be returned to the stepper (or another stepper) for exposure of the semiconductor wafer to another reticle pattern.

Each of the die on a semiconductor wafer are typically separated by regions of the semiconductor wafer referred to as scribe lines. Scribe lines are typically about 100–200 microns wide and are used to separate adjacent die such that the individual die may be cut from the semiconductor wafer. Scribe lines are typically formed incorporating gaps between the die patterns of the reticle pattern used to form the die and by incorporating gaps between the die of adjacent fields. Test structures are typically formed within the scribe lines of a semiconductor wafer. A typical test structure is formed by providing a test structure pattern within a gap between the die patterns of a reticle pattern. When a field is exposed using such a reticle pattern, a pattern for a layer of the test structure is transferred to the wafer. As each test structure is associated with a reticle, when formed on the semiconductor wafer, these test structures are typically isolated from one another, i.e., they are isolated to their corresponding reticle field. When the wafer is cut to separate the individual die, the test structures are obliterated.

SUMMARY OF THE INVENTION

The present invention generally provides a semiconductor substrate having an extended test structure and a method of fabricating such a substrate. A method of forming an extended test structure on a semiconductor substrate, consistent with one embodiment of the invention, includes forming a first test structure pattern over a first portion of the substrate and forming a second test structure pattern of the second portion of the substrate which partially overlaps the first portion of the substrate such that the first test structure pattern and the second test structure overlap. The first test structure pattern may be formed using, for example, a reticle and a second test structure pattern may be formed using the same reticle. The first and second test structure patterns may, for example, be formed in a scribe line of the substrate.

In accordance with one aspect of the invention, forming the second test structure pattern over the second portion of the substrate partially overlapping the first portion of the substrate includes setting a reticle field for the second substrate portion to expose part of the first substrate portion. The reticle field may, for example, be set by adjusting an aperture delimiter.

A semiconductor substrate, consistent with an embodiment of the invention, includes plurality of fields disposed on the wafer. Each of the fields has one or more die. The printed field may, for example, be arranged to contain as many die as will fit, as limited by the field size and resolution of the stepper. An extended test structure is disposed across at least two adjacent fields. Each field may, for example, include at least one or more die and a scribe line disposed between two adjacent die or adjacent to a die of an adjacent field. The extended test structure may be disposed in the scribe lines associated with at least two adjacent fields.

The plurality of fields on a wafer typically includes a first end field adjacent one end of the wafer and a second end field adjacent the other end of the wafer. In accordance with one embodiment of the invention, the test structure extends into at least one of the first and second end fields. In another embodiment, the test structure stops short of the first and second end fields.

The above summary of the present invention is not intended to describe each illustrated embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
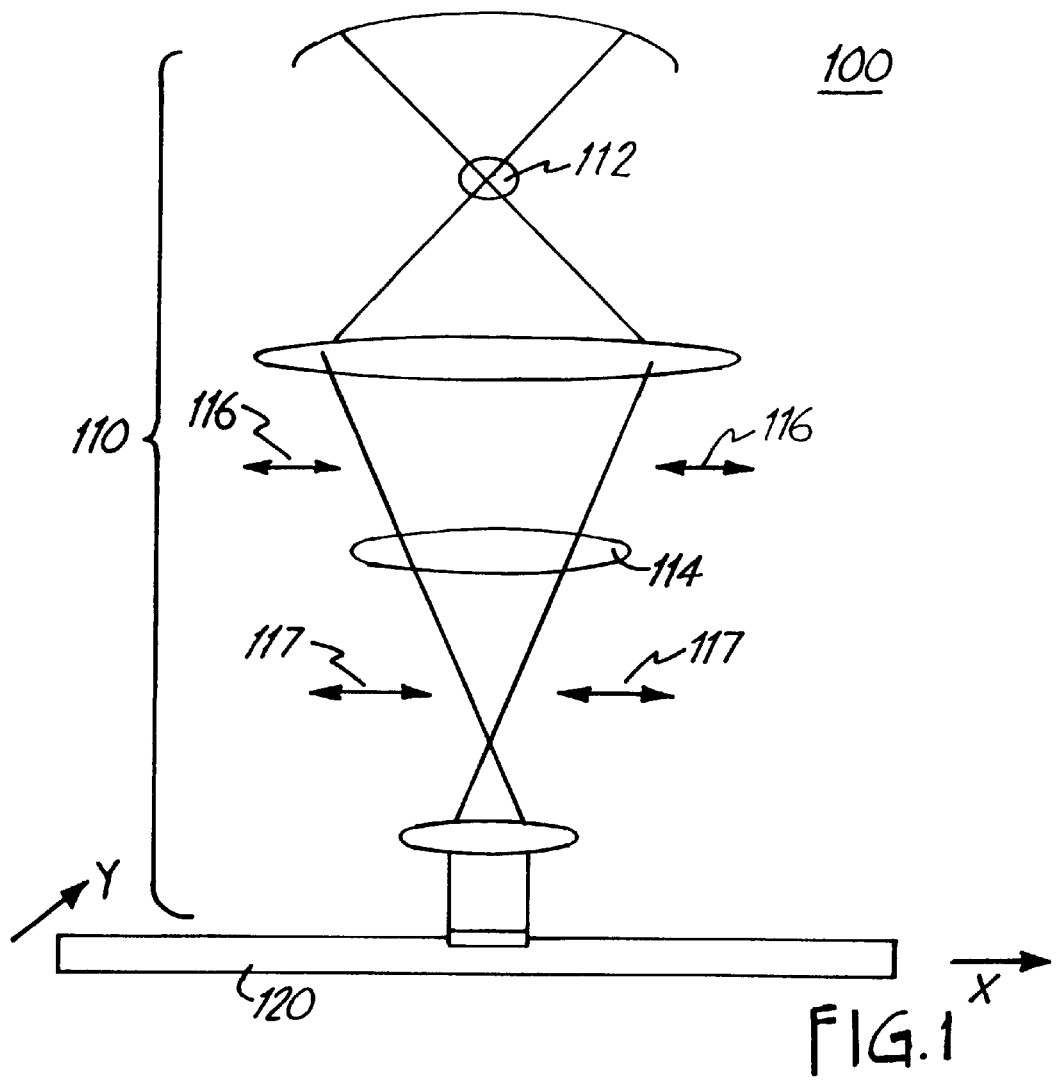
FIG. 1 is a schematic diagram of an exemplary photolithography stepper in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention generally relates to extended test structures on semiconductor substrates. The present invention is particularly adapted to the formation of extended test structures on a semiconductor substrate using step-and-repeat or stepper photolithography systems. While the present invention is not so limited, a greater appreciation of various aspects of the invention will be apparent from a reading of the description that follows.

Turning now to FIG. 1, there is illustrated an exemplary photolithographic step-and-repeat system (or stepper) which may be used in accordance with one embodiment of the invention. The stepper 100 generally includes an optical system 110 for transferring a reticle pattern to a semiconductor substrate 120 and a stepper system (not shown) for stepping or indexing the substrate 120 such that the reticle pattern may be repeatedly transferred to the semiconductor substrate 120. The optical system 110 generally includes a light source 112, such as a mercury vapor lamp, a reticle 114 on which the reticle pattern is defined, and exposure limiting tools 116 which are used to define the reticle field, e.g., the portion of the reticle pattern which is transferred to the substrate and/or the region of the substrate on which the pattern is transferred. The exposure limiting tools 116 or 117 may, for example, include an aperture delimiter, controlled by a stepper program.

The stepper system generally includes a control system for controlling the X and Y position of the semiconductor substrate 120 relative to the optical system 110 and typically aligned to any previous patterned layer. The photolithography stepper 100 may, for example, be a 5X or 10X stepper system in which the transferred pattern is reduced 5 or 10 times from the reticle to the substrate. However, it is stressed that the exemplary stepper 100 is meant to be illustrative only and is not intended to limit the scope of the invention. Those skilled in the art will readily recognize the applicability of many different types of step-and-repeat (stepper) systems that may be used with the present invention.

Figure 2:
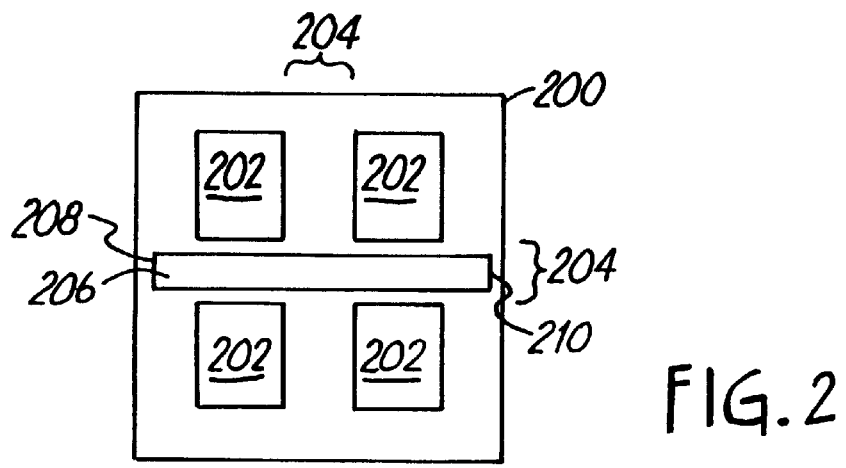
FIG. 2 is an exemplary reticle in accordance with an embodiment of the invention.

FIG. 2 illustrates an exemplary reticle in accordance with an embodiment of the invention. The reticle 200 generally includes two or more die patterns 202 each of which define a pattern for a layer of a die to be formed on a substrate. In the exemplary embodiment, the reticle 200 includes four die patterns 202. One or more or even all of the die patterns 202 may be identical. The die patterns 202 are separated by gaps 204 which when the reticle pattern is transferred to the substrate (e.g., transferred to a photoresist layer over the substrate), correspond to scribe lines between the die formed thereon. Within the gaps 204, a test structure pattern 206 is disposed. The test structure pattern 206 generally defines a pattern used to form a layer of a test structure on the substrate. The exemplary test structure pattern 206 includes two ends 208 and 210 which typically extend beyond the outer edges of the die patterns 202. The ends 208 and 210 of the test structure pattern may be used to interconnect test structure patterns formed in adjacent fields of the substrate, as will be discussed further below. In this manner, an extended test structure may be formed. As noted above, the reticle pattern is generally transferred to the semiconductor substrate using a stepper. As will be discussed further below, the reticle field may be limited such that portions of the reticle pattern (e.g., one or more ends of a test structure pattern) are not transferred to the substrate. This may be done using exposure limiting tools such as aperture delimiters as will be discussed further below.

Figure 3:
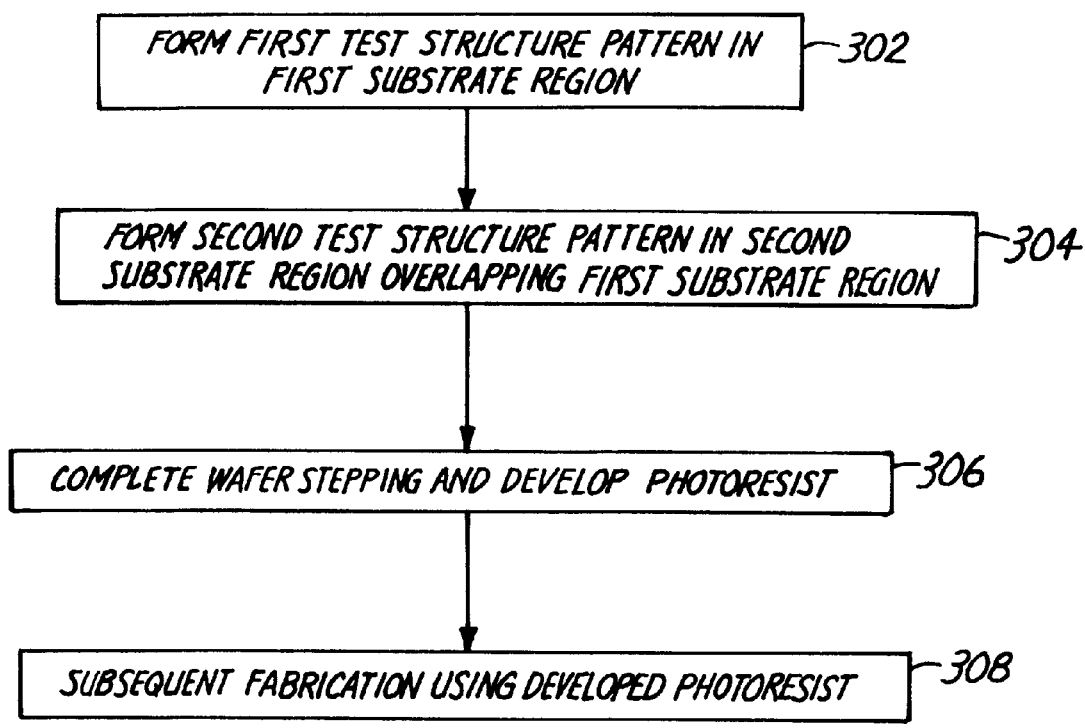
FIG. 3 is a flow chart illustrating an exemplary process in accordance with one embodiment of the invention.

FIG. 3 is a flow chart which illustrates an exemplary process for forming a test structure which extends across adjacent reticle fields in accordance with one embodiment of the invention. In accordance with the exemplary process, a test structure pattern is formed over a substrate region, as indicated at block 302. This typically includes stepping the substrate using a stepper such that the substrate region is aligned with the optical system of the stepper and exposing a photoresist layer over the substrate region to a reticle pattern which includes the test structure pattern. The aperture delimiter of the stepper may be adjusted to define the region or field of the substrate to be exposed as well as the portion of the reticle pattern which is transferred.

After forming the test structure pattern over the substrate, another test structure pattern is formed over an adjacent region of the substrate partially overlapping the first region of the substrate such that the second test structure pattern overlaps the first test structure pattern, as indicated at block 304. This typically involves stepping the substrate to align the adjacent substrate region with the optical system after exposing the first substrate region. The stepping of the substrate is typically sequentional, however the invention is not so limited. The aperture delimiter of the stepper is typically set such that the reticle field or (second substrate region) overlaps the previously-exposed first substrate region. The second substrate region is then exposed to the reticle pattern such that the exposed, second region of the substrate at least partially overlaps the previously-exposed first substrate region. In the overlapping portions of the adjacent exposed field regions, the test structure patterns transferred to the photoresist layer have portions which overlap. Details of the interconnection of the test structure patterns on adjacent fields will be described further below.

The substrate is then stepped to align other substrate regions with the optical system. These regions are then be exposed to the reticle pattern. The other exposed regions may, if desired, also overlap adjacent regions such that the test structure pattern transferred to the substrate extends further across adjacent field regions. An exemplary semiconductor substrate having an extended test structure will be illustrated below. After the entire substrate has been exposed, the photoresist layer is then developed to remove patterned portions of the photoresist layer, as indicated at block 306.

Fabrication continues with subsequent processing steps (e.g., etching, doping, and/or deposition) using the patterned photoresist layer, as indicated at block 308. For example, exposed portions of a wafer layer (such as a dielectric layer) underlying the photoresist may be etched to transfer the reticle pattern to the wafer layer. A metal layer may then be deposited over the etched wafer layer and chemically-mechanically polished to form a metal layer in the form of the reticle pattern. As the test structure patterns extend across adjacent field, portions of the metal layer will extend across adjacent fields. In this manner, a metal layer of a test structure can be formed which extends across one or more adjacent fields. The formation of a metal layer is provided by way of example only.

Figure 4:
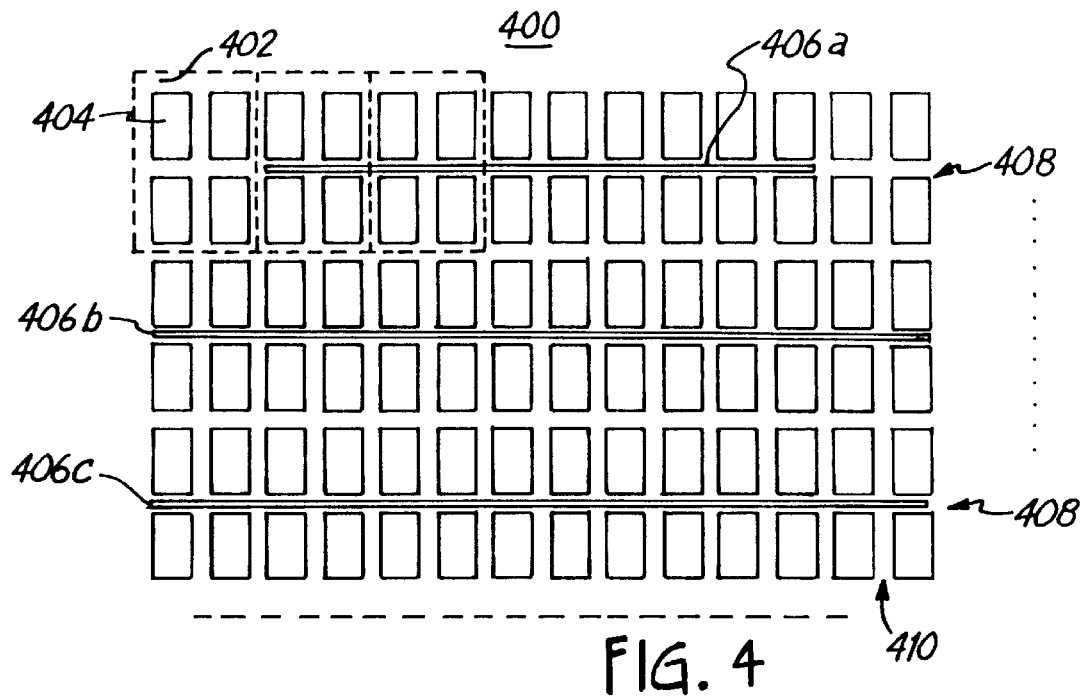
FIG. 4 shows an exemplary semiconductor substrate in accordance with one embodiment of the invention.

FIG. 4 illustrates an exemplary semiconductor substrate having an extended test structure in accordance with one embodiment of the present invention. The illustrated semiconductor substrate 400 generally includes a plurality of fields 402 each of which generally correspond to a reticle field and include one or more die 404. In the example embodiment, each field 402 is associated with four die 404. The substrate 400 further includes one or more extended test structures 406a–c which are disposed across at least two adjacent fields 402. The fields in which an extended test structure is disposed overlap.

Between the die 404 run horizontal and vertical scribe lines 408 and 410, respectively. The extended test structures 406a–406c are typically disposed in the scribe lines and extend across the scribe lines of at least two adjacent fields 402. While the extended test structures 406a–406c are illustrated as horizontal, it should be appreciated that the test structures may be disposed vertically and/or horizontally over the substrate 400.

The extended test structures 406a–c may extend from one end of the semiconductor substrate 400 to the other end of the substrate 400, or either of both ends of an extended test structure may fall short of the end of the substrate. Extended test structures 406b and c illustrate test structures which extend from one end of the substrate to the other. Extended test structure 406a illustrates a test structure which has at least one end that falls short of the end of the substrate 400.

Figure 5:
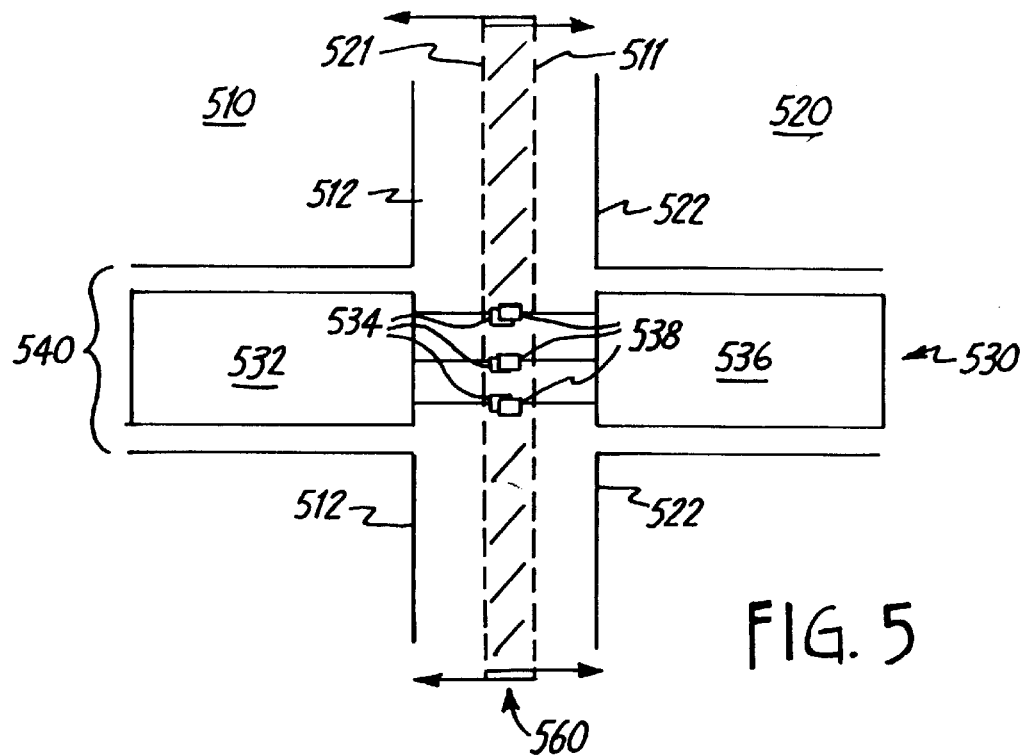
FIG. 5 illustrates an exploded view of an exemplary semiconductor substrate across two adjacent fields.

Turning now to FIG. 5, there is illustrated an exploded partial view of an extended test structure interconnected between two adjacent fields. The extended test structure 530 is disposed in a scribe line 540 between two die 512 of a first field 510 and two die 522 of a second adjacent field 520. The edge of the first field 510 is illustrated with dashed line 511 while the edge of the second field 520 is illustrated with dashed line 521. As can be seen, the two fields 510 and 520 overlap in an overlap region 560.

The extended test structure 530 includes two substructures 534 and 536 which are respectively formed in the first field 510 and adjacent field 520. Each test substructure 532 and 536 typically include metal features 534 and 538, respectively, which overlap in the overlap region 560 to interconnect the two test substructures 532 and 536. In this manner, an extended test structure may be formed across adjacent reticle fields. The metal features 534 and 538 may, for example, be metal pads. The size of the metal features is typically selected in order to provide adequate surface area such that the metal features of adjacent reticle fields may overlap taking into account the tolerance of the processing employed The metal feature dimensions may also be selected to allow for the features to be contacted for testing. Suitable dimensions of a metal feature are 0.5 by 0.5 microns or larger, for example.

Figure 6:
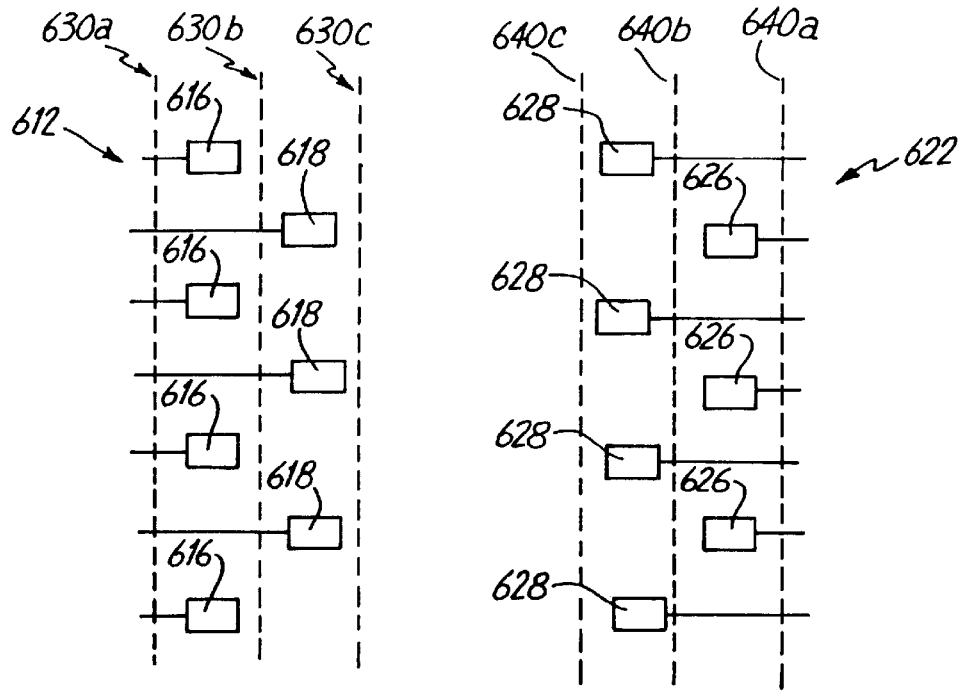
FIGS. 6–9 diagramatically illustrates exemplary processes for selectively connecting test structure portions in adjacent fields in accordance with another embodiment of the invention.

With reference to FIGS. 6–9, exemplary processes for selectively connecting test structure patterns of adjacent fields will be discussed. In FIG. 6, there is illustrated the right end 612 and left end 622 of a test structure pattern. The dashed lines 630a–c and 640a–c illustrate exemplary positions of an aperture delimiter used to limit the portion of the test structure pattern which is transferred to the substrate (as well as to define the region of the substrate which is exposed to the reticle pattern).

Each end 612 and 622 of the reticle pattern includes a number of short metal features 616 and 626 and long metal features 618 and 628, respectively. As will be discussed in FIGS. 7 and 8 below, the aperture delimiter may be set to a combination of positions 630a, 630b or 630c when exposing a first substrate region, and 640a, 640b, or 640c when exposing an adjacent substrate region in order to selectively interconnect metal feature patterns of the adjacent substrate fields.

Figure 7:
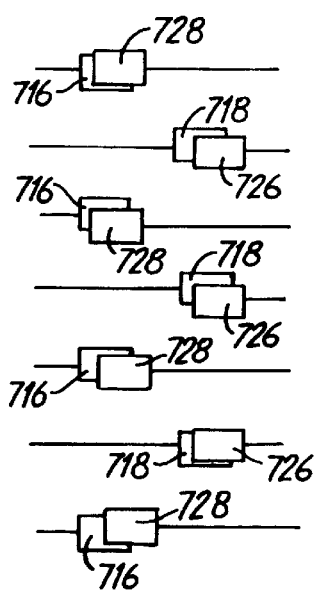

To fully interconnect the metal feature of adjacent substrate regions, an aperture delimiter is set to position 630c for exposing a first substrate region and the aperture delimiter is set to position 640c when exposing a rightwardly adjacent substrate region. This aperture delimiter positioning fully exposes the substrate to the short and long metal features 616 and 618 during the first reticle flash and the short and long metal features 626 and 628 during the second reticle flash. The resultant structure is illustrated in FIG. 7. The resultant structure includes short metal features 716 at the left end of the first substrate field interconnected with long metal features 728 at the right end of the second substrate field, and long metal features 718 at the left end of the first substrate field which are interconnected with the short metal features 726 at the right end of the second substrate field. It can also be seen that the metal features of adjacent field regions typically do not precisely overlap. Yet, the metal feature patterns are provided with sufficient dimensions to provide overlap despite the tolerances in the processing employed.

Figure 8:
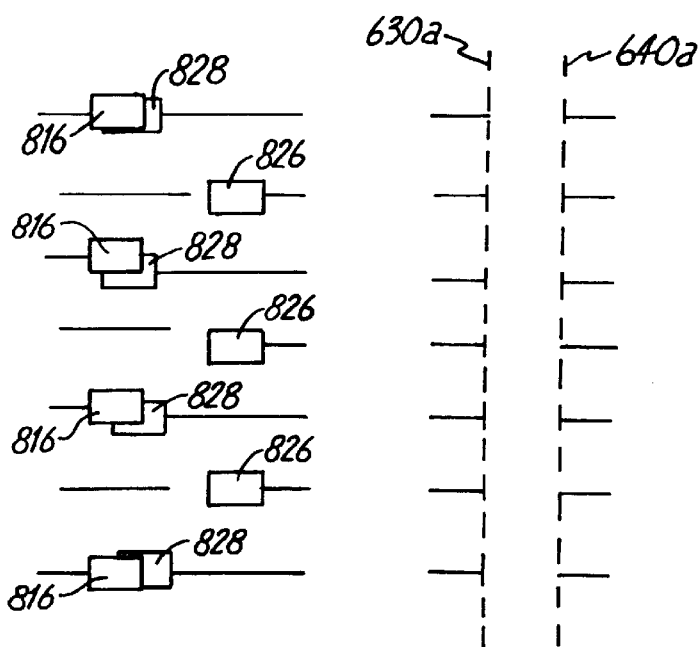

The metal feature patterns between adjacent reticle fields may also be partially connected. This may be done, for example, by setting the aperture delimiter to position 630b for a first reticle flash and setting the aperture delimiter to position 640c during a subsequent reticle flash of a rightwardly adjacent substrate field. The resultant structure is illustrated in FIG. 8. The resultant structure includes short metal features 816 at the right end of the first substrate region which are interconnected with long metal features 828 the right end of the second substrate region. While the short metal features 826 are printed at the right end of the second substrate region, they are not interconnected with long metal features since the positioning of the aperture delimiter at position 630b cuts off (i.e., prevents the printing of) the long metal features 618 at the left end of the test structure pattern of FIG. 6.

Figure 9:
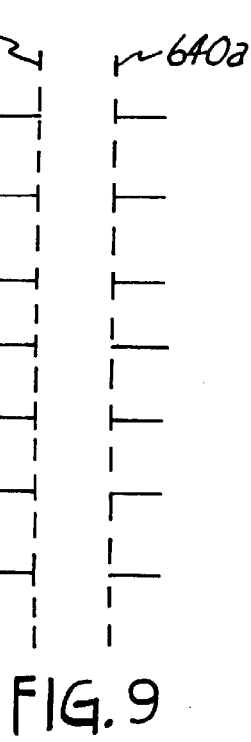

The metal features of adjacent reticle fields may also be completely disconnected. This may, for example, be performed by setting an aperture delimiter to position 630a or 630b during a first reticle flash and/or positioning the aperture delimiter to position 640a or 640b during a second, adjacent reticle flash. An exemplary structure formed by setting the aperture delimiter to position 630a during the first reticle flash and 640a during the second reticle flash is illustrated in FIG. 9. As can be seen, none of the metal features are printed. In this manner, the test structure pattern of adjacent substrate fields may be selectively isolated from one another.

Using the above techniques, test structures which extend across adjacent reticle fields may be formed using a stepper system. This allows for the formation of large area test structures which can, for example, be used to determine random defects in the semiconductor fabrication process. The determination of random defects can, in turn, be used to estimate the processing yield of the semiconductor device. The extended test structures may also be used in the determination of capacitances or interconnect delays for long interconnect lines. Moreover, by providing a method for selectively interconnecting test structure patterns of adjacent reticle fields, extended test structures which do not extend to the edge of the substrate may be formed. In this manner, processing variations near the edge of the substrate can be eliminated from the resultant test structure.

As noted above, the present invention is applicable to the fabrication of a number of different extended test structures using a number of different techniques. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A method of forming a semiconductor test structure on a substrate, comprising:

forming a layer of photoresist over the substrate;

exposing a portion of the photoresist layer over a first field of the substrate to a reticle pattern defining two or more die patterns and a test structure pattern having oppositely-facing ends each closer to a corresponding edge of the reticle pattern than the die patterns;

exposing a portion of the photoresist layer over a second field of the substrate to the reticle pattern, wherein the second field is adjacent to the first field and wherein the reticle pattern transferred to the second substrate field partially overlaps the reticle pattern transferred to the first substrate field such that each of the die patterns is formed in its respective field without overlapping another one of the die patterns and such that part of the test structure pattern in the first field of the substrate overlaps part of the test structure pattern in the second substrate field;

developing the exposed portions of the photoresist layer to remove portions of the photoresist layer; and using the developed photoresist layer to form a metal layer.

2. The method of claim 1, wherein using the developed photoresist layer to form the metal layer includes:

etching exposed portions of a layer underlying the photoresist layer to form lines in the underlying layer; and depositing metal in the lines.

3. The method of claim 2, wherein exposing portions of the photoresist layer over the second portion of the substrate includes setting a reticle field for the second substrate portion to expose part of the photoresist layer over the first substrate portion.

4. A method of forming a semiconductor test structure extending over multiple fields of a substrate, comprising:

forming a layer of photoresist over the substrate;

projecting a reticle pattern on to a portion of the photoresist layer over a first field of the substrate, the reticle pattern defining a die group with at least one die pattern and a test structure pattern with opposite ends closer to respective edges of the reticle pattern than the die group;

projecting the reticle pattern on to a portion of the photoresist layer over a second field of the substrate adjacent the first field of the substrate, wherein the reticle pattern projected on to the second field partially overlaps the reticle pattern projected on to the first field such that the die pattern on each of the first and second fields are formed in their respective fields without overlap thereof and such that part of the test structure pattern in the first field of the substrate overlaps part of the test structure pattern in the second substrate field in a scribe line between the die pattern of the first and second field; and forming a test structure extending between the first and second fields using the overlapped test structure patterns.

5. The method of claim 4, wherein forming a test structure includes developing the photoresist layer, after projecting the reticle pattern thereon to, to remove portions of the photoresist layer and using the developed photoresist layer to form a metal layer.

6. The method of claim 4, wherein projecting the reticle pattern on to the first field includes setting a reticle field to project the test structure pattern on to the first field and wherein projecting the reticle pattern on to the second field includes setting a reticle field to project the test structure pattern on to the second field, thereby interconnecting the test structure patterns of the first and second fields.

7. The method of claim 4, wherein projecting the reticle pattern portions on to the first field includes setting a reticle field to project a portion of the test structure pattern on to the first field and wherein projecting the reticle pattern on to the second field includes setting a reticle field to project a portion of the test structure pattern on to the second field, thereby interconnecting at least one portion of the test structure patterns of the first and second fields.

8. The method of claim 4, wherein the second field lies on the edge of the substrate.

9. The method of claim 4, further including:

projecting the reticle pattern on to a portion of the photoresist layer over a third field of the substrate adjacent the second field of the substrate; and during projecting, defining a reticle field for one or more of the second field and third field such that the test structure patterns of the second field does not overlap with the test structure pattern of the third field.

10. The method of claim 9, wherein third field is on an edge of the substrate.

11. A method of forming a semiconductor test structure extending over multiple fields of a substrate, comprising:

forming a layer of photoresist over the substrate;

projecting a reticle pattern, defining at least one die pattern and a test structure pattern, on to the photoresist layer over multiple fields of the substrate such that the die pattern transfers to each of the fields without overlapping with a die pattern on adjacent fields;

wherein projecting the reticle pattern on to the photoresist layer includes selectively interconnecting the test structure patterns of adjacent fields.

12. The method of claim 11, wherein the test structure pattern includes metal feature patterns on each end thereof and selectively interconnecting the test structure patterns between adjacent fields includes selectively interconnecting the metal feature patterns of the adjacent fields.

13. The method of claim 12, wherein selectively interconnecting the metal feature patterns of adjacent fields includes interconnecting the metal features of test structure patterns on two adjacent fields.

14. The method of claim 12, wherein selectively interconnecting the metal feature patterns of adjacent fields includes interconnecting all of the metal features of each test structure pattern on two adjacent fields.

15. The method of claim 14, wherein interconnecting all of the metal features of each test pattern on two adjacent fields includes projecting a long and a short metal pattern feature on to each of the two adjacent fields so that the long metal feature pattern from a respective one of the two adjacent fields interconnects with the short metal feature pattern of a respective other one of the two adjacent fields.

16. The method of claim 11, wherein the reticle pattern includes two or more die patterns, defining a die group, the die group defining two oppositely-facing edges, each of the ends of the test structure being closer to an edge of the reticle pattern than a proximate one of the edges of the die group.

17. The method of claim 11, wherein projecting the reticle pattern on to the photoresist layer includes interconnecting test structures from multiple fields to form an extended test structure extending from a first field on one edge of the substrate to a second field on an opposite edge of the substrate.

* * * * *